United States Patent
Stumpf

(10) Patent No.: US 9,070,745 B1
(45) Date of Patent: Jun. 30, 2015

(54) METHODS AND SYSTEMS FOR FORMING SEMICONDUCTOR LAMINATE STRUCTURES

(71) Applicant: Lam Research Corporation, Fremont, CA (US)

(72) Inventor: John F. Stumpf, Kettering, OH (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 14/105,566

(22) Filed: Dec. 13, 2013

(51) Int. Cl.
*H01L 21/00* (2006.01)
*H01L 21/76* (2006.01)
*H01L 21/30* (2006.01)
*H01L 21/762* (2006.01)
*H01L 21/67* (2006.01)

(52) U.S. Cl.
CPC .... *H01L 21/76254* (2013.01); *H01L 21/67011* (2013.01); *H01L 21/67155* (2013.01)

(58) Field of Classification Search
USPC ............... 438/118, 406, 455; 257/E21.088, 257/E21.122, E21.48, E21.512, E21.567
See application file for complete search history.

(56) References Cited

U.S. PATENT DOCUMENTS

| | | | |
|---|---|---|---|
| 6,822,326 B2* | 11/2004 | Enquist et al. | 257/729 |
| 2002/0115263 A1* | 8/2002 | Worth et al. | 438/455 |
| 2005/0099467 A1* | 5/2005 | Bibl et al. | 347/68 |
| 2011/0151644 A1* | 6/2011 | Vaufredaz | 438/459 |

OTHER PUBLICATIONS

Direct bonding—Wikipedia; https://en.wikipedia.org/wiki/Direct_bonding; dated Apr. 13, 2014; 7 pages.
Martin A. Schmidt; "Wafer-to-Wafer Bonding for Microstructure Formation"; Proceedings of the IEEE, vol. 86, No. 8, Aug. 1998; p. 1575-1585.

* cited by examiner

*Primary Examiner* — Mohsen Ahmadi

(57) ABSTRACT

In one embodiment, a method for forming a direct fusion bond between fractional components of a semiconductor laminate structure can include generating one or more direct bonding surfaces on each of a plurality of semiconductor wafers. A first fractional component and a second fractional component can be cut from at least one of the plurality of semiconductor wafers. A second direct bonding surface of the second fractional component can be placed into contact with a first direct bonding surface of the first fractional component to define an initial contact area. An angle of approach between the second direct bonding surface of the second fractional component and the first direct bonding surface of the first fractional component can be closed to create a direct fusion bond of a semiconductor laminate structure. The direct fusion bond can be larger than the initial contact area.

25 Claims, 14 Drawing Sheets

2

METHODS AND SYSTEMS FOR FORMING SEMICONDUCTOR LAMINATE STRUCTURES

BACKGROUND

The present specification generally relates to methods and systems of forming a variety of semiconductor laminate structures from a plurality of fractional components of one or more semiconductor wafers. Semiconductor structures can be produced from semiconductor ingots which can be cut into discs and then machined into the semiconductor structure. Semiconductor structures produced in this manner can be limited by the size of the semiconductor ingot and can be expensive to manufacture.

Accordingly, a need exists for alternative methods and systems of producing semiconductor parts without relying on semiconductor ingot machining.

SUMMARY

In one embodiment, a method for forming a direct fusion bond between fractional components of a semiconductor laminate structure can include generating one or more direct bonding surfaces on each of a plurality of semiconductor wafers. A first fractional component and a second fractional component can be cut from at least one of the plurality of semiconductor wafers. The first fractional component can include a first direct bonding surface of the one or more direct bonding surfaces. The second fractional component can comprise a second direct bonding surface of the one or more direct bonding surfaces. The first direct bonding surface of the first fractional component and the second direct bonding surface of the second fractional component can be dried. The first fractional component can be constrained with an assembly block. The second direct bonding surface of the second fractional component can be placed into contact with the first direct bonding surface of the first fractional component to define an initial contact area. An angle of approach can be formed between the second direct bonding surface of the second fractional component and the first direct bonding surface of the first fractional component. The angle of approach between the second direct bonding surface of the second fractional component and the first direct bonding surface of the first fractional component can be closed to create a direct fusion bond of a semiconductor laminate structure. The direct fusion bond can be larger than the initial contact area.

In another embodiment, a system for manufacturing semiconductor laminate structures can include a cleanroom, a cutting station, an assembly station, a first robot arm, and a second robot arm. The cutting station and the assembly station can each be housed within the cleanroom. The cutting station can include a water waveguide laser mounted above a fixture. The assembly station can include an assembly table and one or more assembly blocks disposed on the assembly table. The first robot arm can be interposed between the cutting station and the assembly station. The fixture of the water waveguide laser can be configured to hold a semiconductor wafer as it is cut into a first fractional component and a second fractional component by a laser beam of the water waveguide laser. The first robot arm can be configured to grasp the first fractional component and engage the first fractional component with the assembly table of the assembly station. The first robot arm can be configured to place a first direct bonding surface of the first fractional component into contact with a second direct bonding surface of the second fractional component at an initial contact end of each fractional component and form an initial contact area and an angle of approach between the first direct bonding surface of the first fractional component and the second direct bonding surface of the second fractional component. The second robot arm can be configured to close the angle of approach between the first direct bonding surface of the first fractional component and the second direct bonding surface of the second fractional component to create a direct fusion bond of a semiconductor laminate structure.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

As is noted above, the present disclosure relates to semiconductor laminate structures and methods of manufacturing semiconductor laminate structures, such as, but not limited to, direct bonded semiconductor laminate structures.

Figure 1:
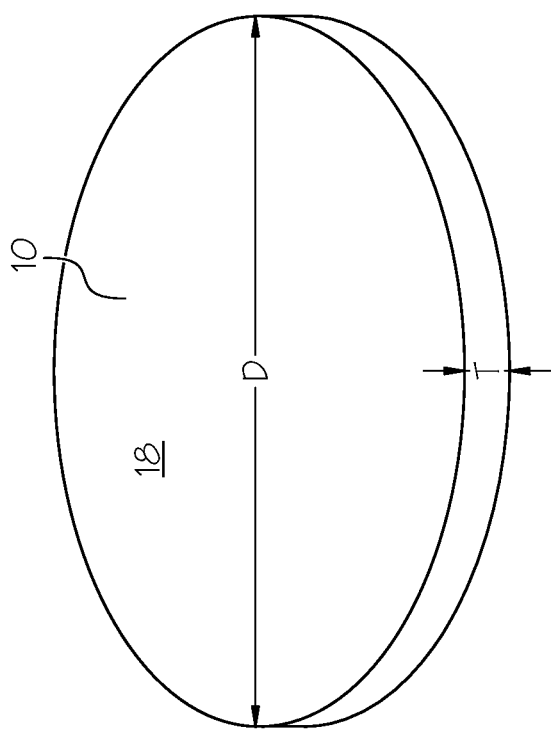
FIG. 1 schematically depicts a semiconductor wafer according to one or more embodiments shown and described herein.

Referring now to FIG. 1, a semiconductor wafer 10 is depicted. A semiconductor wafer 10 can be a thin, cylindrical slice of semiconductor material. Suitable semiconductor materials include, but are not limited to, silicon, gallium arsenide, sapphire, silicon carbide or any other compound III-V or II-VI material. Additionally, applicants have discovered that the embodiments described herein can be particularly beneficial for use with single crystal silicon. Semiconductor wafers 10 can be used in the fabrication of microdevices such as, for example, integrated circuits. Moreover, semiconductor wafers 10 can be utilized to fabricate semiconductor laminate structures 100 according to the manufacturing system 200 disclosed herein.

Semiconductor wafers 10 are available in a variety of diameters D. A semiconductor wafer 10 can be formed in a standard size that ranges from about 25 mm to about 450 mm. In the present manufacturing system 200, semiconductor wafers 10 can be provided having a variety of thicknesses T that range from about 0.275 mm to about 0.925 mm. It is noted that, a decreased thickness T can reduce manufacturing time because thinner semiconductor wafers 10 can be cut faster than thicker semiconductor wafers 10. Furthermore, semiconductor wafers 10 having relatively small diameters D can be comparatively thinner without increasing the risk of cracking or breaking the semiconductor wafer 10 during the various processes of the present disclosure. The machines and stations described herein can be outfitted to process a variety of sizes of semiconductor wafers 10.

Figure 2:
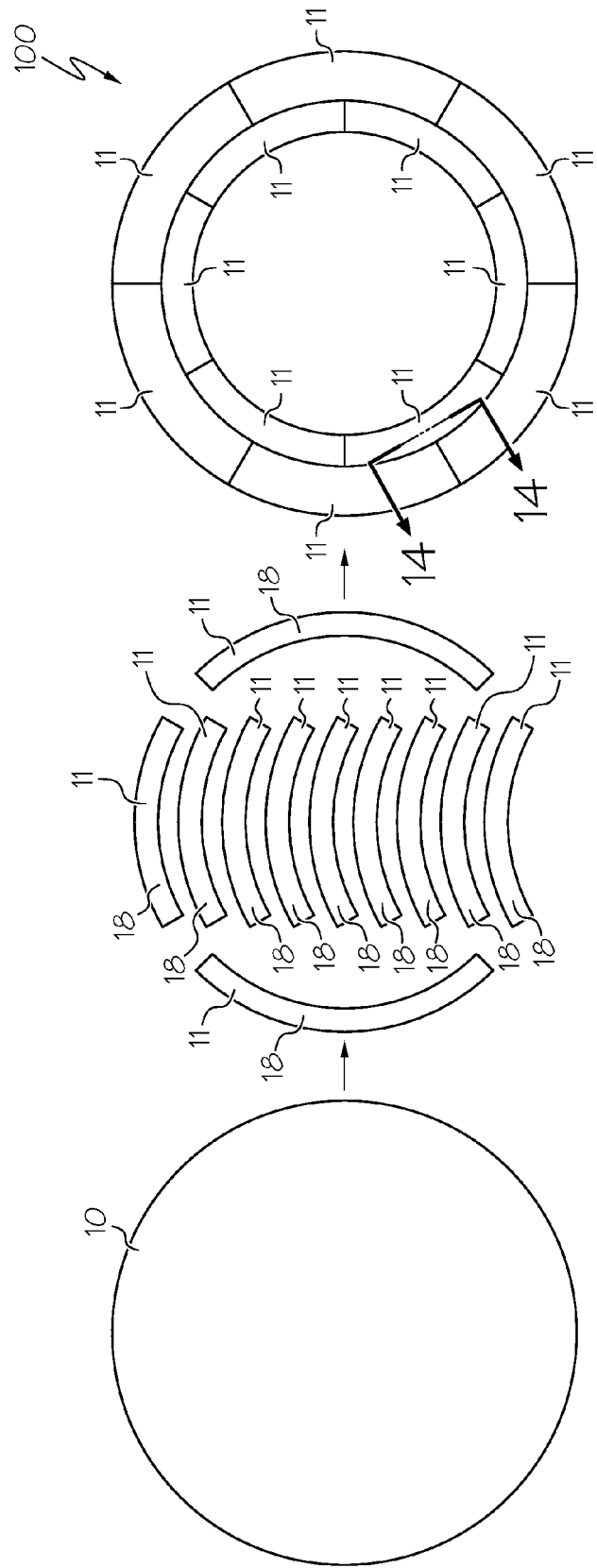
FIG. 2 schematically depicts a semiconductor wafer, a plurality of fractional components, and a semiconductor laminate structure according to one or more embodiments shown and described herein.

Referring collectively to FIGS. 1 and 2, one or more semiconductor wafers 10 can be cut into fractional components 11, such as those depicted in FIG. 2, and assembled into semiconductor laminate structures 100 that are larger than the semiconductor wafer 10. For example, semiconductor laminate structures 100 can be formed from semiconductor wafers 10 with dimensions that exceed the diameter D of the semiconductor wafers 10. For example, in one embodiment, a semiconductor laminate structure 100 having a diameter of about 450 mm or more can be created using semiconductor wafers 10 having a 300 mm diameter as the only material input. A semiconductor wafer 10 can be cut into fractional components 11. The fractional components 11 of the semiconductor wafer 10 can be assembled via direct bonding. In some embodiments, the semiconductor wafers 10 comprise direct bonding surfaces 18 that are flat and smooth enough to facilitate direct fusion bonding. In other embodiments, the semiconductor wafers 10 can be cleaned or otherwise surface modified to generate direct bonding surfaces 18. The direct bonding surfaces 18 can be hydrophilic or hydrophobic. Hydrophilic direct bonding surfaces 18 can be characterized by a small contact angle between a drop of water and a direct bonding surface 18, such as, for example, 5° or less. Hydrophobic direct bonding surfaces 18 can be characterized by a large contact angle between a drop of water and a direct bonding surface 18, such as, for example, 90° or more. Two direct bonding surfaces 18 that are sufficiently smooth, and atomically clean can form a direct fusion bond there between when placed into contact. The direct bonding surfaces 18 can have a surface roughness Ra of 50 angstroms or less, such as, for example, 25 angstroms surface roughness Ra or less or, for example, about 1-5 angstroms surface roughness Ra. The direct fusion bond can be formed by intermolecular interactions including van der Waals forces, hydrogen bonds, and covalent bonds.

Accordingly, the fractional components 11 can be used as building blocks to form semiconductor laminate structures 100 having multiple layers formed from fractional components 11. The semiconductor laminate structures 100 described herein can be formed into any predetermined volumetric shape that can be assembled from a plurality of fractional components 11. For example, the predetermined volumetric shape can be defined initially, and then decomposed into a plurality of defined shapes that can be cut from one or more semiconductor wafers 10. The semiconductor laminate structure 100 can be formed with as few as 2 layers of fractional components 11 or as many as 100 layers or more of fractional components 11. As a result, the semiconductor laminate structures 100 can have larger dimensions than the provided semiconductor wafers 10. Thus, the semiconductor laminate structure 100 can be formed into various objects such as, for example, electrodes for semiconductor processing chambers, gas manifolds, mass flow controllers, or any other consumable part for a semiconductor processing chamber.

Figure 3:
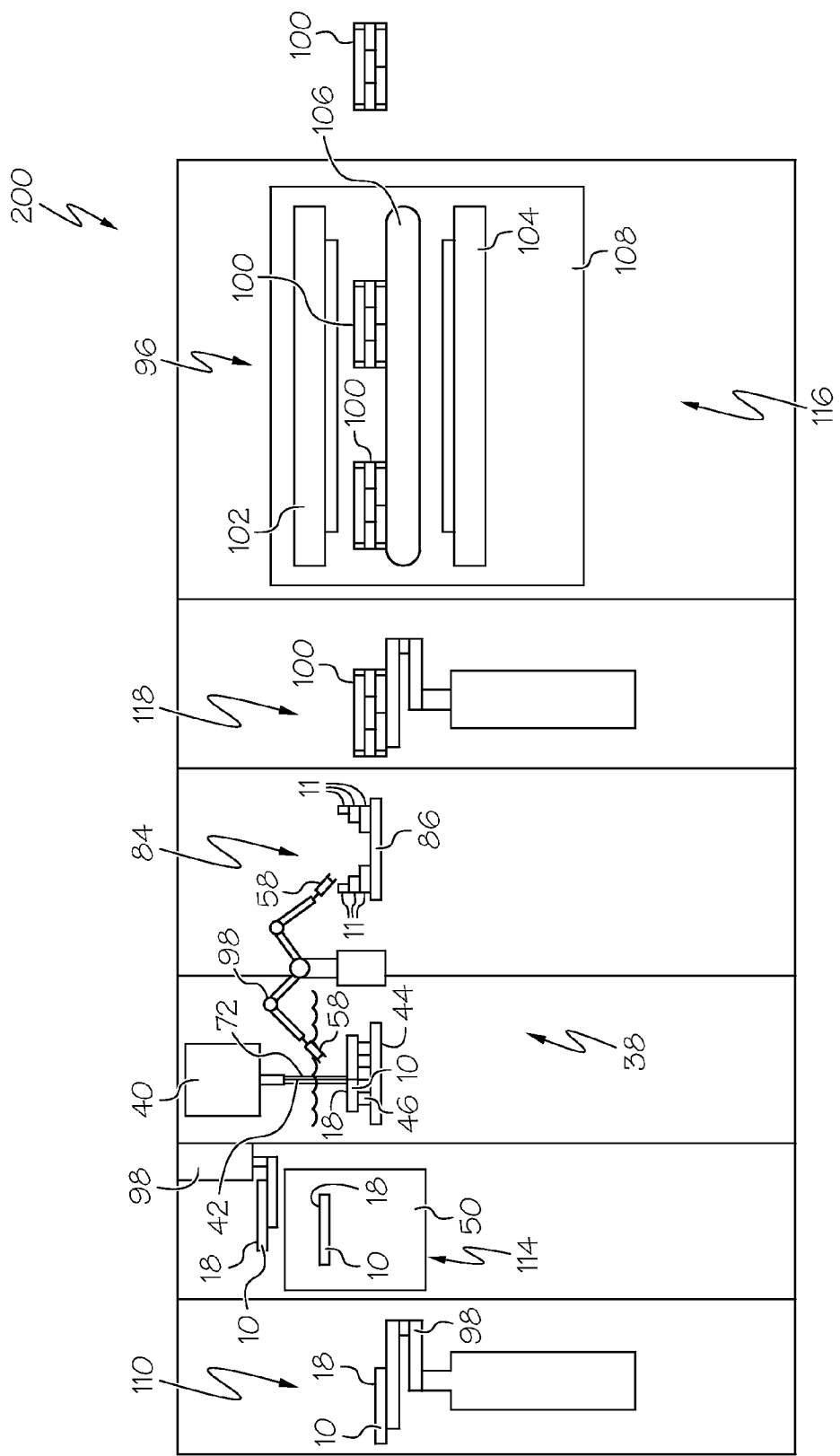
FIG. 3 schematically depicts a semiconductor laminate structure manufacturing system according to one or more embodiments shown and described herein.

Referring now to FIG. 3, the present manufacturing system 200 may comprise multiple machines and apparatuses organized in multiple stations to produce semiconductor laminate structures 100 from semiconductor wafers 10. In some embodiments, the manufacturing system 200 can be located within a clean room environment. The manufacturing system 200 may include a semiconductor wafer handling station 110 for the introduction of semiconductor wafers 10, a cleaning station 114 for cleaning and activating the direct bonding surfaces of a semiconductor wafer 10, a cutting station 38 for cutting a semiconductor wafer 10 into fractional components 11, an assembly station 84 for assembling fractional components 11 into semiconductor laminate structures 100, and a semiconductor laminate structure handling station 118. In some embodiments, the manufacturing system 200 can further comprise an annealing station 116 for annealing the semiconductor laminate structures 100.

In some embodiments, the manufacturing system 200 can comprise one or more robot arms 98 configured to manipulate semiconductor wafers 10, fractional components 11, semiconductor laminate structures 100 or combinations thereof. The robot arms 98 can be capable of articulating along one or more axis. Optionally, the one or more robot arms 98 can be configured for use in clean rooms. Accordingly, the one or more robot arms 98 can comprise robotic systems such as, for example, Staubli six DOF robots or the like. Although reference is made to a particular robotic system, the embodiments described herein can include any robot capable of allowing the manufacturing of semiconductor laminate structures 100 automatically without substantial human intervention. As is explained in greater detail herein, the one or more robot arms 98 can be operable to transport semiconductor wafers 10, fractional components 11, and semiconductor laminate structures 100 throughout the manufacturing system 200. Additionally, the one or more robot arms 98 can be operable to assemble fractional components 11 into semiconductor laminate structures 100.

In some embodiments, after semiconductor wafers 10 are cut into fractional components 11, the one or more robot arms 98 can be configured to transport the fractional components 11 throughout the manufacturing system 200. Specifically, one or more robot arms 98 can be positioned at and/or between the cutting station 38 and the assembly station 84 to transport fractional components 11 from the cutting station 38 to the assembly station 84. Further, robot arms 98 can assemble the fractional components 11 into semiconductor laminate structures at the assembly station 84.

Still referring to FIG. 3, the manufacturing system may comprise a cleaning station 114 for removing contaminants, such as, dust, dirt, or other particles, from semiconductor wafers 10. These contaminants can disrupt direct fusion bonding of fractional components 11. The cleaning station 114 may comprise a cleaning process for cleaning semiconductor wafers 10 without damaging or deleteriously altering the semiconductor wafers 10. In some embodiments, the cleaning process environment for semiconductor wafers 10 can meet ISO 14644-1 cleanroom standards, such as, for example, ISO class 2 and ISO class 4 standards. In some embodiments, semiconductor wafers 10 can be cleaned in an environment that meets FED STD 209E cleanroom standards, such as, for example, class 1 and class 10 standards. Once cleaned, the semiconductor wafers 10 may comprise one or more direct bonding surfaces 18.

The cleaning station 114 can include a cleaning apparatus 50 that removes particles and activates direct bonding surfaces 18 of semiconductor wafers 10 to prepare the direct bonding surfaces 18 for direct fusion bonding. In some embodiments, the cleaning station 114 uses semiconductor wafer cleaning methods and equipment. In some embodiments, the semiconductor wafers 10 can be cleaned with weak acids. Additionally, multiple semiconductor wafers 10 can be batch cleaned simultaneously.

Figure 4:
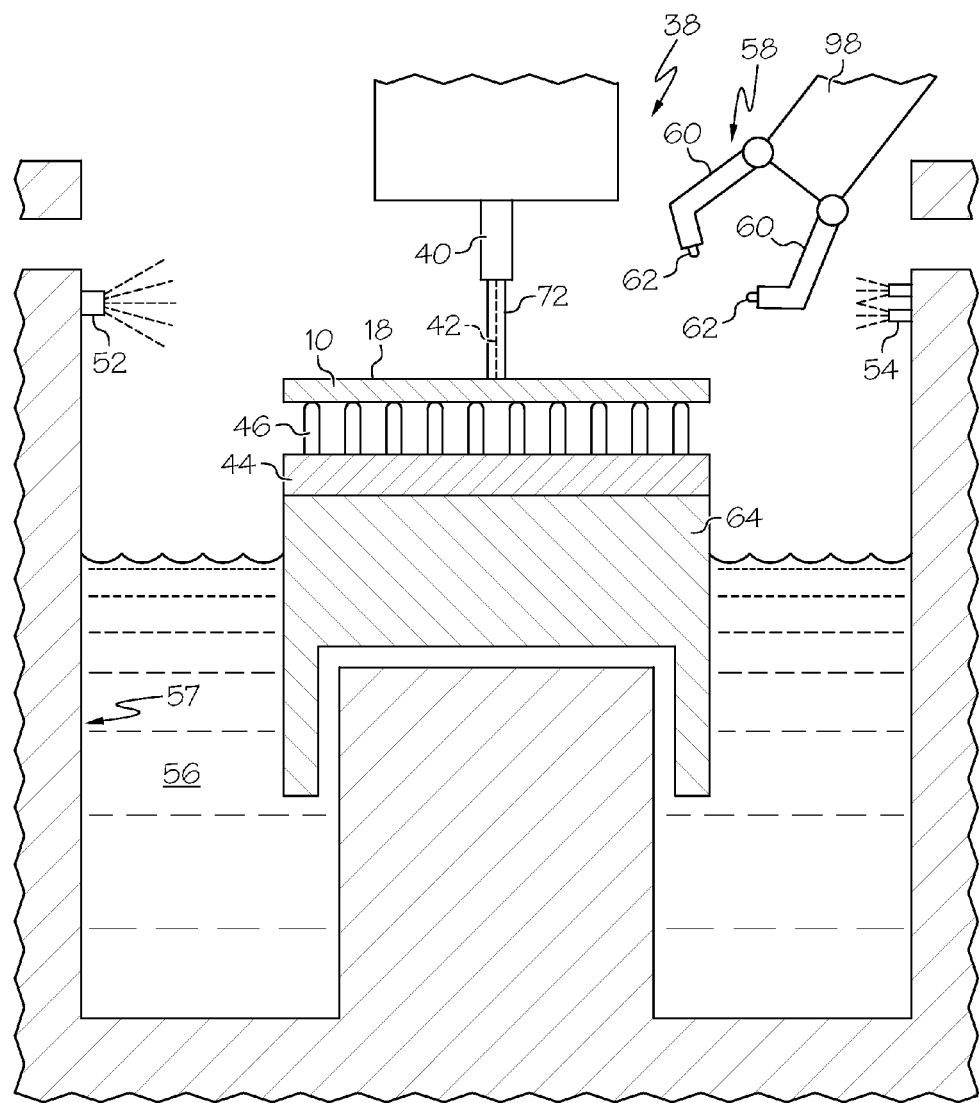
FIG. 4 schematically depicts a cutting station according to one or more embodiments shown and described herein.

Referring collectively to FIGS. 3 and 4, the manufacturing system 200 can comprise a cutting station 38. In some embodiments, the cutting station 38 can be located within a clean room. The cutting station 38 may be configured to cut provided semiconductor wafers 10 into fractional components 11. The fractional components 11 created at the cutting station 38 can be any predetermined size or shape that can be contained within the semiconductor wafer 10. Additionally, the applicant has discovered that the cutting station 38 can cut semiconductor wafers 10 into fractional components 11 without disrupting any direct fusion bonding surfaces 18 of the semiconductor wafers 10 and the fractional components 11. The cutting station 38 may comprise a water waveguide laser 40, which cuts the semiconductor wafers 10, and a fixture 44 which holds the semiconductor wafers 10 during the cut.

In some embodiments, the cutting station 38 comprises a water waveguide laser 40 for cutting semiconductor wafers 10 into fractional components 11. The water waveguide laser 40 may comprise a laminar water jet 72 which can operate as a waveguide to propagate light waves of a laser beam 42 towards a semiconductor wafer 10. The laminar water jet 72 can also cool the material of semiconductor wafer 10 at the location of the cut, as the laser beam 42 performs the cut. Additionally, the laminar water jet 72 of the water waveguide laser 40 can include oxidizers in the water to oxidize the fractional components 11 as they are being cut. Suitable oxidizers include hydrogen peroxide, deionized water saturated with oxygen, ozonated deionized water fluorine, chlorine, nitric acid or any other oxidizing agent suitable for oxidizing semiconductor material. This can prepare the fractional components 11 for an etching step which can remove some or all imperfections created on the surface and edges of a fractional component 11 during the cutting process. For example, when the semiconductor material comprises silicon, the imperfections can comprise silicon dioxide.

Figure 5A:
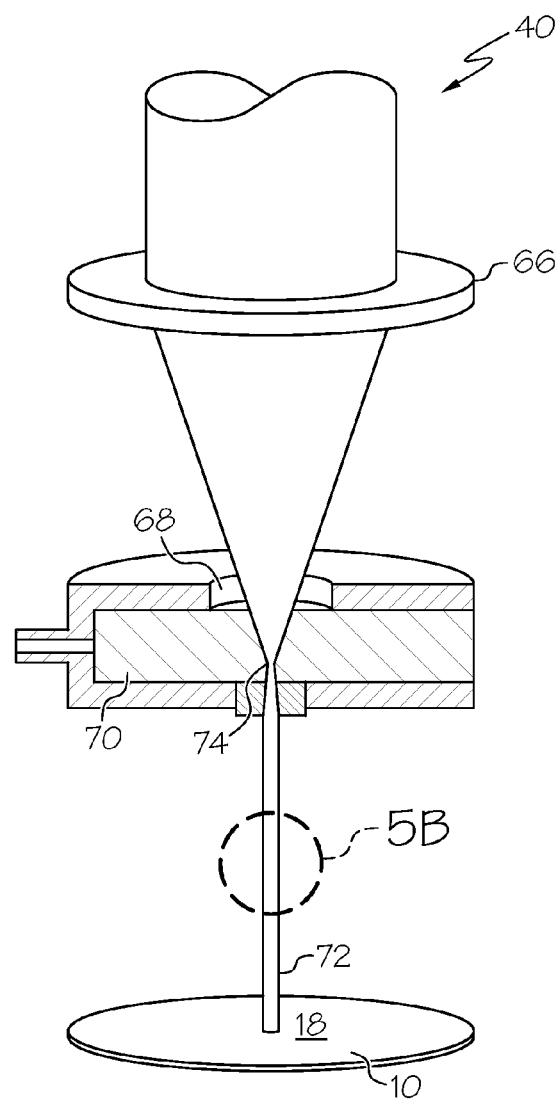
FIG. 5A schematically depicts a water waveguide laser according to one or more embodiments shown and described herein.
Figure 5B:
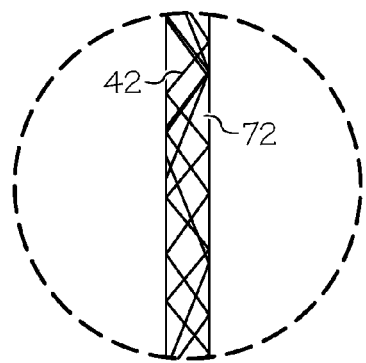
FIG. 5B schematically depicts a partial view of a laminate water jet of a water waveguide laser according to one or more embodiments shown and described herein.

Referring now to FIGS. 5A and 5B, an embodiment of the water waveguide laser 40 is schematically depicted. The water waveguide laser 40 may comprise a focusing lens 66 configured to focus a laser beam 42 into a window 68 located on a top surface of a water chamber 70. In some embodiments, the water chamber 70 can be pressurized. The laser beam 42 can be focused through the water chamber 70 into a laminar water nozzle 74, located on a bottom surface of a water chamber 70. The laminar water nozzle 74 can release a laminar water jet 72 at various pressures, for example low pressure. The geometry of the laminar water nozzle 74 can be arranged such that the laser beam 42 couples with the laminar water jet 72.

Figure 6:
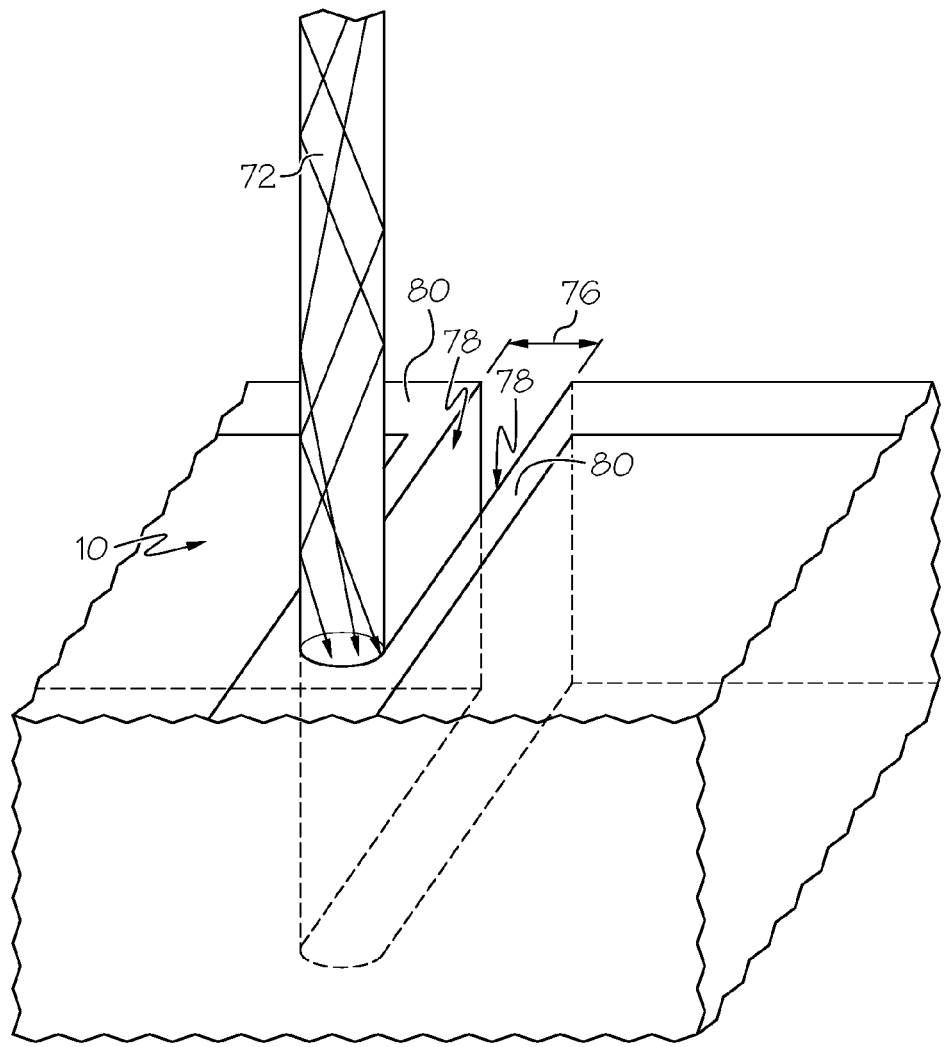
FIG. 6 schematically depicts a water waveguide laser cutting a semiconductor wafer according to one or more embodiments shown and described herein.

Referring now to FIG. 6, the laminar water jet 72 can operate as a waveguide for the laser beam 42. A waveguide can be formed because of the total reflection of the laser beam 42 at the transition zone between the laminar water jet 72 and the air. This water waveguide can function in a manner analogous to fiber optic waveguides. In operation, the laser beam 42 and the laminar water jet 72 can strike the semiconductor wafer 10 at substantially the same location. The laser beam 42 can cut a cutting width 76 into a semiconductor wafer 10 that is substantially equivalent to a diameter of the laminar water jet 72. In some embodiments, the laminar water jet 72 can cool the material of semiconductor wafer 10 on the cut edge 78 and on the surface of the semiconductor wafer 10. The laser beam 42 can be pulsed, creating intervals where only the laminar water jet 72 strikes the semiconductor wafer 10, to enhance cooling along the cut edge 78 to mitigate thermal damage, which is represented as a section of molten material 80. Further, the applicant has discovered that when used in the various embodiments described herein, laser beam 42 of the water waveguide laser 40 can be configured to not compromise the direct bonding surfaces of the fractional components 11 (FIG. 2). In some embodiments, the water waveguide laser 40 can move vertically and/or horizontally. In some embodiments, the water waveguide laser 40 can be capable of multi-axis movement such as, for example, six-axis movement. An exemplary embodiment of a water waveguide laser 40 is a Synova laser dicing system powered by Laser Microjet®. Other configurations and embodiments of the water waveguide laser 40 are also contemplated.

Referring again to FIG. 4, the cutting station 38 can further comprise a fixture 44 and a stage 64. A semiconductor wafer 10 can be placed on the fixture 44 which can be configured to support and not damage the semiconductor wafer 10 while the water waveguide laser 40 cuts the semiconductor wafer 10 into fractional components 11 (FIG. 2). Referring still to FIG. 4, the fixture 44 can be coupled to the stage 64, which can provide support for the fixture 44. The stage 64 can be fixed or can provide motion along one or more axis such as, for example, six-axis motion. In some embodiments, the stage 64 can be directly engaged with the fixture 44. Additionally, the fixture 44 may comprise pins 46 that translate into and out of the fixture 44. In the present manufacturing system, a semiconductor wafer 10 can be delivered to the cutting station 38 and placed on pins 46 which can allow for minimal surface area contact with a semiconductor wafer 10.

In some embodiments, the pins 46 can be housed within holes of the fixture 44. In some embodiments, the pins 46 can be localized in one or more cutting areas of a fixture 44 or spread all over the surface of the fixture 44. Alternatively, the pins 46 can be positioned around the perimeter of the fixture 44. The pins 46 can be selectively translatable, such that each pin 46 can operate separately from every other pin 46. After a semiconductor wafer 10 is cut into fractional components 11 (FIG. 2) the pins 46 that are in contact with undesired portions of the semiconductor wafer 10 can descend into the fixture 44, lowering the undesired portions of the semiconductor wafer 10 away from the fractional components 11. Accordingly, a robot arm 98 can be provided with space to grip a fractional component 11 and move it away from the cutting station 38.

Referring collectively to FIGS. 2 and 4, in some embodiments, the cutting station 38 can be a wet station. Accordingly, the cutting station 38 can comprise misting nozzles 52 configured to mist water onto semiconductor wafers 10 as they are being transported to the cutting station 38. The misting nozzles 52 can further be configured to mist water onto semiconductor wafers 10 as they are being cut into fractional components 11 with the water waveguide laser 40. The cutting station 38 can further comprise a water drainage basin 57 where water 56 generated by the water waveguide laser 40 and/or the misting nozzles 52 can gather. In some embodiments, the water 56 can be re-circulated to the misting nozzles 52 and the water waveguide laser 40.

Referring collectively to FIGS. 2-4, the fractional components 11 can be dried before they are assembled into semiconductor laminate structures 100. The drying process can remove water without introducing contaminants to the fractional components 11. Accordingly, the manufacturing system 200 may utilize isopropyl alcohol vapor, spin drying, vacuum baking, ultra-pure Nitrogen gas or any other drying process configured to dry the fractional components 11 without introducing contaminants. In embodiments using isopropyl alcohol vapor, the isopropyl alcohol vapor may comprise nitrogen and isopropyl alcohol. The drying can occur between the cutting station 38 and the assembly station 84. In some embodiments, the isopropyl alcohol vapor nozzles 54 can spray a mist of isopropyl alcohol vapor to dry the fractional components 11. Isopropyl alcohol vapor drying can be configured to not destroy the direct bonding surfaces 18 of the fractional components 11. In some embodiments, the fractional components 11 can be dried using a Marangoni drying process. In some embodiments, the fractional components 11 can be dried as they are transported between the cutting station 38 and the assembly station 84. Alternatively, a separate drying station for storing and drying the fractional components 11 can be added to the manufacturing system 200 between the cutting station 38 and the assembly station 84.

Figure 7A:
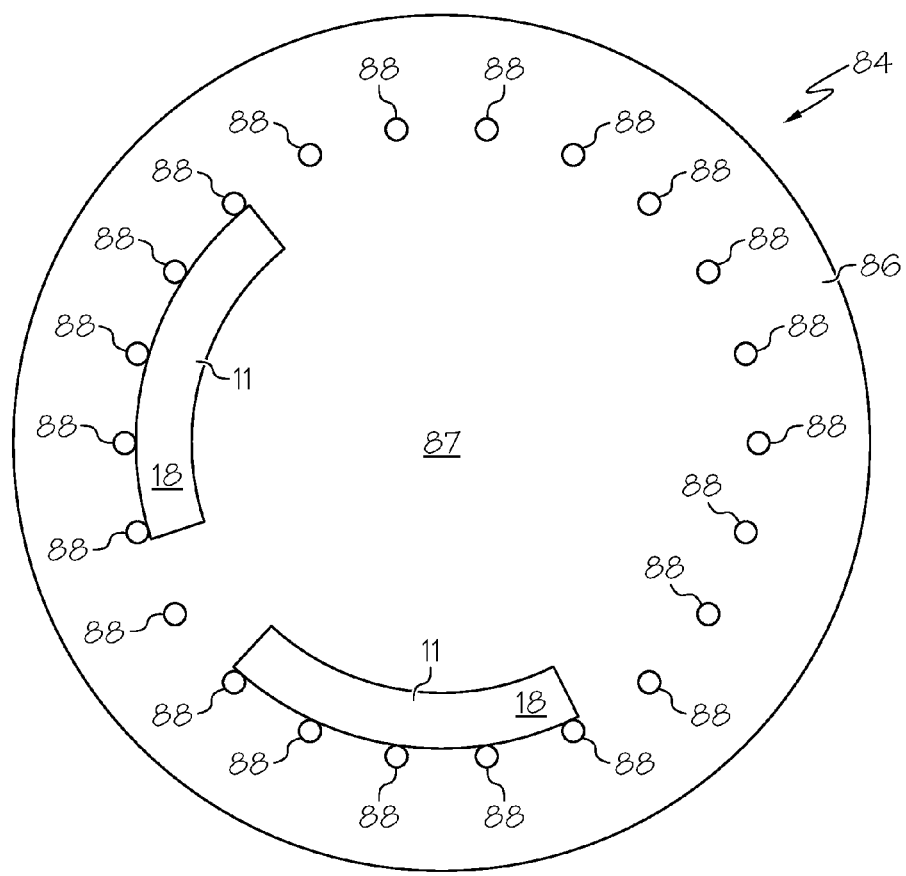
FIG. 7A schematically depicts an assembly table according to one or more embodiments shown and described herein.
Figure 7B:
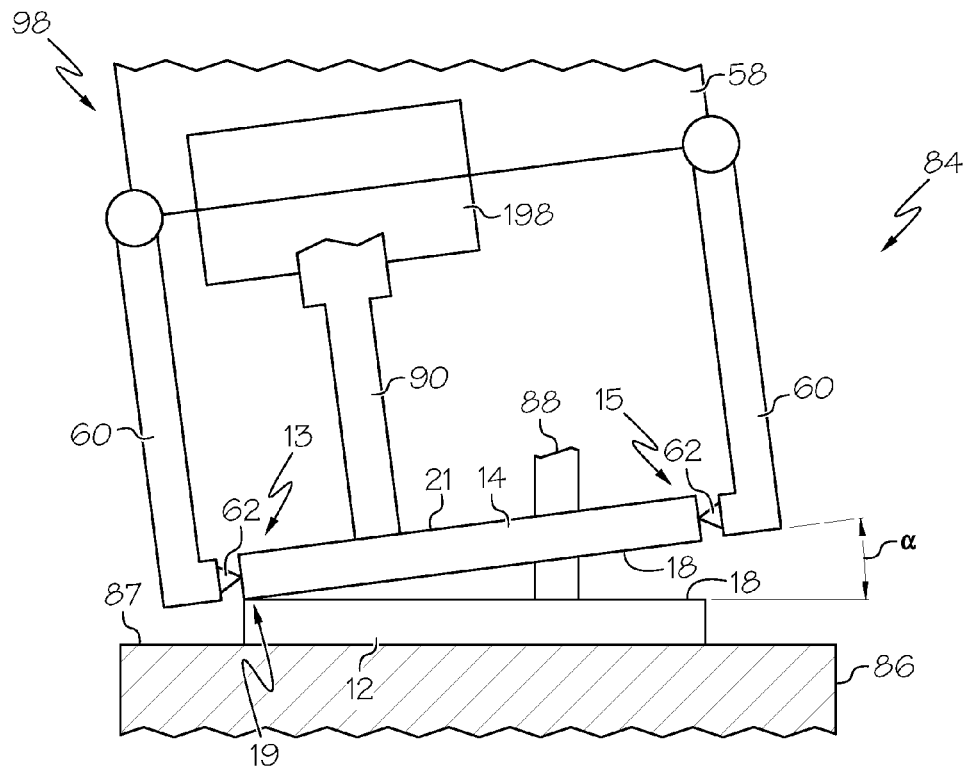
FIG. 7B schematically depicts the assembly of two fractional components according to one or more embodiments shown and described herein.

The manufacturing system 200 can further comprise an assembly station 84 for assembling fractional components 11 into semiconductor laminate structures 100. As is noted above, the manufacturing system 200 can produce semiconductor laminate structures 100 that are larger than the semiconductor wafers 10. As depicted in FIGS. 7A and 7B, a first fractional component 12 can be placed on the assembly table 86 and a second fractional component 14 can be placed into contact with the first fractional component 12 at an initial contact end 13 of each fractional component 12 and 14. This initial contact can create an angle of approach a between the two fractional components 12 and 14. The angle of approach a can then be reduced, creating a wave front which removes the void between the first fractional component 12 to the second fractional component 14 and direct fusion bonds the fractional components 12 and 14. In some embodiments, as the angle of approach a is reduced, a direct bond can be created between the two fractional components, 12 and 14. The two direct bonded fractional components 12 and 14 can form a part of a semiconductor laminate structure 100. In some embodiments, the semiconductor laminate structure 100 can remain secured by the assembly table 86 while additional fractional components 11 are direct fusion bonded to the semiconductor laminate structure 100.

The assembly table 86 can provide a semiconductor contacting surface 87 free of contaminants for assembly of semiconductor laminate structures 100. The assembly table 86 can be located in a cleanroom which can be optionally $N_2$ purged. In some embodiments, the assembly table 86 can comprise assembly blocks 88 configured to laterally engage fractional components 11 during a direct bonding assembly process. The assembly blocks 88 can be outer diameter posts or wall bumps arranged around the outer diameter of the assembly table 86. In some embodiments, the assembly table 86 can be fixed. Alternatively, the assembly table 86 can be configured to tilt to adjust the angle of fractional components 11.

Figure 7C:
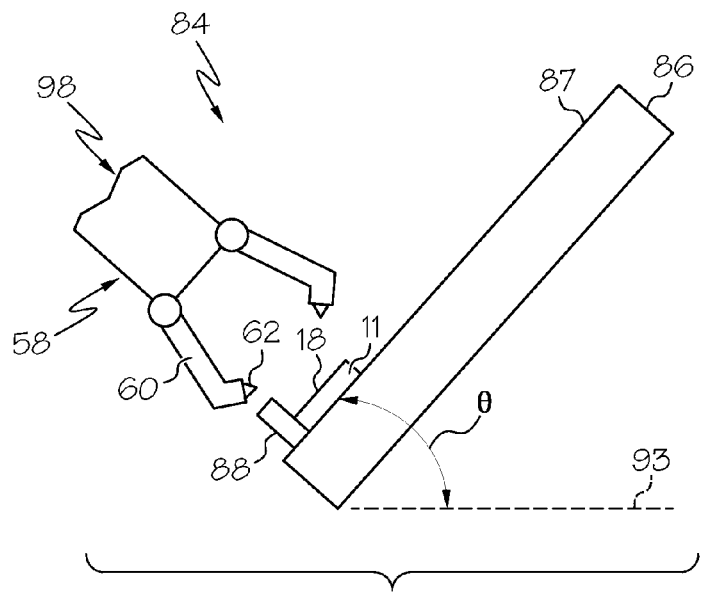
FIG. 7C schematically depicts a tilted assembly table according to one or more embodiments shown and described herein.

Referring collectively to FIGS. 3 and 7C, the assembly table 86 can tilt to adjust a tilt angle θ measured from the semiconductor contacting surface 87 of the assembly table 86 and a level plane 93, i.e., representing a level surface orthogonal to gravity. The fractional component 11 can be constrained with one or more assembly blocks 88. In some embodiments, one or more robot arms 98, can be located between the cutting station 38 and the assembly station 84. The one or more robot arms 98 can be configured to move the fractional components 11 from the cutting station 38 to the assembly station 84.

Referring now to FIG. 7B, the one or more robot arms 98 can comprise a robotic end effecter 58 for arranging a first fractional component 12 and a second fractional component 14 on the semiconductor contacting surface 87 of the assembly table 86. The robot arm 98 can be outfitted with a robotic end effecter 58 for holding the first fractional component 12, the second fractional component 14, or both. A robotic end effecter 58 can be mounted to the one or more robot arms 98 such that the one or more robot arms 98 is operable to move the robotic end effecter 58 along one or more axis of motion. The robotic end effecter 58 can comprise jaw members 60 that articulate with respect to the robotic end effecter 58 to provide a gripping or clamping action. In some embodiments, each of the jaw members 60 can comprise enhanced lateral force gripper tips 62 for grasping fractional components 12, 14. The enhanced lateral force gripper tips 62 can taper to a peak that provides a contacting tip portion for contacting the fractional components 12, 14. The enhanced lateral force gripper tips can be configured to be non-marring or can be configured to create a small plastic deformation in the semiconductor material. In embodiments configured for non-marring, the enhanced lateral force gripper tips 62 can comprise material suitable for handling semiconductor material having a lower hardness than the semiconductor material such as, for example, plastic, or the like. In embodiments configured for creating small plastic deformations, the peak of the enhanced lateral force gripper tips 62 can comprise material suitable for handling semiconductor material having a higher hardness than the semiconductor material such as, for example, diamond, or the like. Accordingly, the enhanced lateral force gripper tips 62 can be urged into the material with sufficient force to change the phase of the semiconductor material and form a small plastic indentation in the semiconductor material. In some embodiments, the assembly station 84 can further comprise a second robot arm 198 for urging the first fractional component 12 and the second fractional component 14 into contact with one another. Specifically, the second robot arm 198 can comprise a pusher member 90 configured to urge the first fractional component 12 and the second fractional component 14 into contact from an initial contact end 13 towards a non-contacting end 15, in order to place the first fractional component 12 and the second fractional component 14 into complete and direct contact with one another. The pusher member 90 can comprise material suitable for handling semiconductor material.

Figure 8:
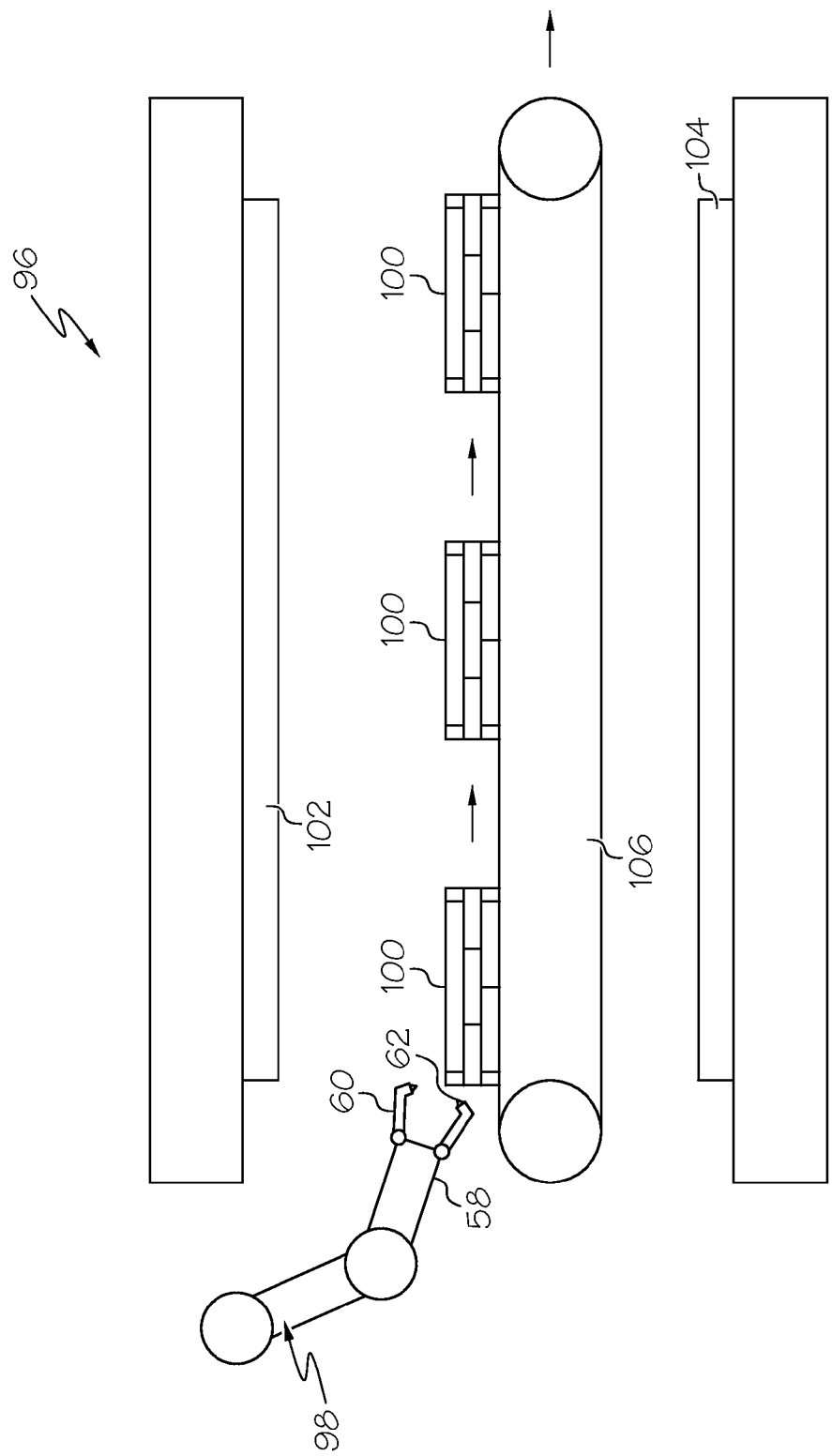
FIG. 8 schematically depicts an annealing oven according to one or more embodiments shown and described herein.

Referring collectively to FIGS. 3 and 8, the manufacturing system 200 may further comprise an annealing oven 96. Annealing a semiconductor laminate structure 100 can increase the bond strength between the bonded fractional components 11 of a semiconductor laminate structure 100. Annealing can also increase the durability of the semiconductor laminate structure 100 and can drive oxygen out of a semiconductor laminate structure 100. The annealing process may comprise heating the semiconductor laminate structure 100 above a critical temperature, maintaining the critical temperature, and then cooling the semiconductor laminate structure 100.

The annealing process can be performed in an annealing oven 96 such as, for example, a linear continuous oven operating from about 800° C.-1,000° C. Other annealing oven 96 temperatures can be used, such as, for example, between about 150° C.-300° C., about 300° C.-700° C., and above 700° C. For semiconductor laminate structures 100 formed from semiconductor wafers 10 comprising silicon, an annealing temperature between about 150° C.-300° C. can cause Si—F—H—Si bonds to form in the direct fusion bonds of semiconductor laminate structures 100, an annealing temperature above 300° C. can cause redundant hydrogen atoms to diffuse in the direct fusion bonds of semiconductor laminate structures 100, resulting in covalent Si—Si bonds in the bond layers, and an annealing temperature at or above 700° C., the direct fusion bonds comprise covalent Si—Si bonds. In some embodiments, direct fusion bonds comprising covalent Si—Si bonds can increase the bond strength of a semiconductor laminate structure 100. In some embodiments, the annealing oven 96 may comprise a top heater 102 located above a conveyer belt 106 of the annealing oven 96 and a bottom heater 104 located below the conveyer belt 106. Each of the top heater 102 and the bottom heater 104 can comprise a quartz infrared heater. The conveyer belt 106 can be configured to carry parts through the annealing oven 96 along a conveying direction (generally indicated by arrows), and a nitrogen purge to introduce nitrogen into the annealing process. Alternatively or additionally, the fractional components 11 can be annealed before they are assembled into semiconductor laminate structures 100. In some embodiments, one or more sharp corners of a semiconductor laminate structure 100 can be rounded using scanning atmospheric reactive-ion and/or reactive-atom etching after the annealing process.

Referring collectively to FIGS. 2 and 3, the semiconductor laminate structures 100 described herein can be formed from fractional components 11 using the manufacturing system 200. Exemplary methods are described below for forming semiconductor laminate structures 100 from fractional components 11. It is noted that the methods described herein are provided for clarity and are not intended to limit the embodiments described herein.

A semiconductor wafer 10 can be loaded into the manufacturing system 200 at the semiconductor wafer handling station 110. For example, one or more robot arms 98 can be configured to receive and transport the semiconductor wafer 10. The semiconductor wafer 10 can then be transported robotically to the cleaning station 114. At the cleaning station 114, the semiconductor wafer 10 can be cleaned, removing contaminants from the semiconductor wafer 10. Exemplary cleaning processes can include, for example, a pre-diffusion cleaning process, a particle removal process using chemical or mechanical scrubbing, a metallic ion removal cleaning process, and a film removal cleaning process. The film removal cleaning process may comprise oxide, nitride, silicon, and metal etching and stripping. Accordingly, direct bonding surfaces 18 of the semiconductor wafer 10 can be prepared or enhanced for direct fusion bonding.

Referring collectively to FIGS. 3 and 4, the semiconductor wafer 10 can be transported to the cutting station 38 where the semiconductor wafer 10 can be cut into fractional components 11. In some embodiments, the semiconductor wafer 10 can be placed on the pins 46 of a fixture 44. The water waveguide laser 40 can be directed to cut the semiconductor wafer 10 into fractional components 11 such that each of the fractional components 11 corresponds to a predetermined shape. The predetermined shape can comprise arcs, rectangles, squares or any other shape suitable for assembly into a semiconductor laminate structure 100.

Referring collectively to FIGS. 3, 5A, 5B and 6, applicant has discovered that the water waveguide laser 40 can impart defects upon the fractional components 11. Accordingly, the methods described herein can further comprise oxidizing the fractional components 11 and removing the defects from the fractional components 11 after they are oxidized. In some embodiments, the defects can be oxidized by including additives in the laminar water jet 72 of the water waveguide laser 40. In addition to cooling the semiconductor wafer 10 as cuts are made to reduce the quantity of defects, the laminar water jet 72 can oxidize the defects that cannot be prevented by the cooling effect of the water. The laminar water jet 72 of the water waveguide laser 40 can be oxidized by saturating the deionized water of the laminar water jet 72 with oxygen such as, for example, with a bubbling mechanism. Alternatively or additionally, the deionized water of the laminar water jet 72 can be ozonated ($O_3$). Moreover, the laminar water jet 72 can comprise hydrogen peroxide ($H_2O_2$) for oxidizing the undesired defects.

Figure 10:
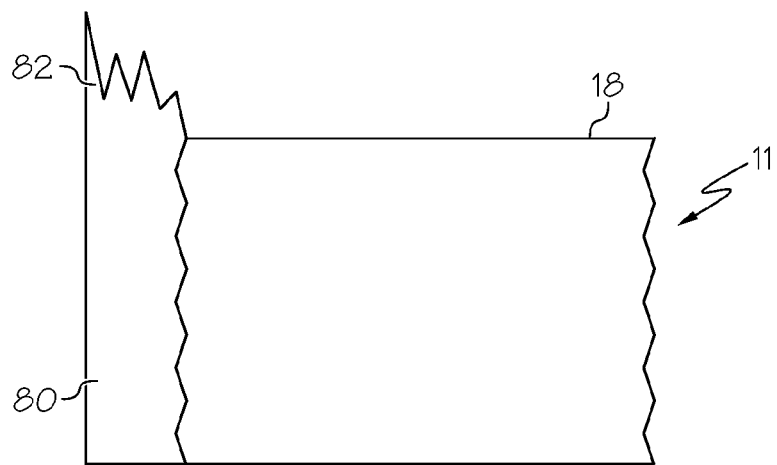
FIG. 10 schematically depicts a fractional component of a semiconductor wafer with a laser cut according to one or more embodiments shown and described herein.

Referring collectively to FIGS. 6 and 10, the defects can include a section of molten material 80 near the cut edge 78 of the semiconductor wafer 10, a burr 82 of material added during cutting a fractional component 11, or both. While not intended to be bound to theory, it is believed that when the laminar water jet 72 includes oxidizing additives, the semiconductor material of the semiconductor wafer 10 reacts with the additive to oxidize the defect as it is created. For example, should the semiconductor wafer 10 be formed from silicon, the oxidizing additives can react with the silicon to form silicon dioxide ($SiO_2$). Accordingly, the oxidized defect can be removed from the semiconductor wafer 10 or the fractional component 11 to smooth the direct bonding surfaces 18 in preparation for direct bonding, i.e., the silicon can be smoothed by preferentially etching the silicon dioxide. Specifically, hydrofluoric acid (HF) can be utilized to etch away the silicon dioxide without damaging the silicon. It is noted that, while oxidization and etching are described with respect to silicon, the oxidization and etching can be applied to any of the semiconductor materials described herein.

Referring again to FIGS. 3 and 4, in embodiments where the fractional components 11 are cut in a wet environment, the fractional components 11 can be dried prior to proceeding to the direct bonding step. As is noted above, the fractional components 11 can be dried with isopropyl alcohol vapor, which can be supplied via the isopropyl alcohol vapor nozzles 54. The applicant has discovered that isopropyl alcohol vapor promotes drying without deleterious effects to the direct bonding surfaces 18 of the fractional components 11.

Referring collectively to FIGS. 3 and 7A-7C, the fractional components 11 can be transported by the one or more robot arms 98 to the assembly station 84 for assembly into a semiconductor laminate structure 100. The fractional components 11 can be assembled into semiconductor laminate structures 100 at the assembly table 86 of the assembly station. In some embodiments, assembly blocks 88 can be arranged around the perimeter of an assembly table 86 and fractional components 11 can be placed into lateral contact with the assembly blocks 88. Accordingly, the assembly blocks 88 and the semiconductor contacting surface 87 of the assembly table 86 can cooperate to constrain the motion of the fractional components 11. It is noted that, while the assembly blocks 88 are depicted as being arranged circumferentially around the assembly table 86, the assembly blocks 88 and the assembly table 86 can form any desired fixture to constrain the fractional components 11 while being assembled into a semiconductor laminate structure 100.

Figure 9A:
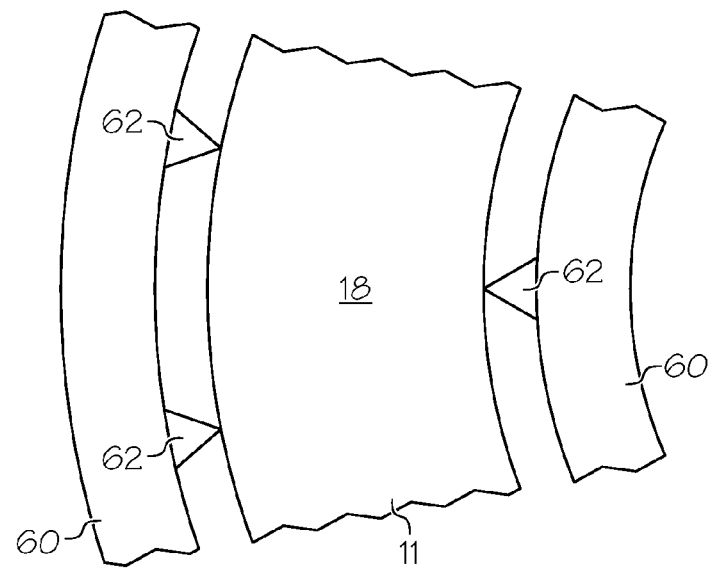
FIG. 9A schematically depicts an end effector jaw engaged with a fractional component according to one or more embodiments shown and described herein.
Figure 9B:
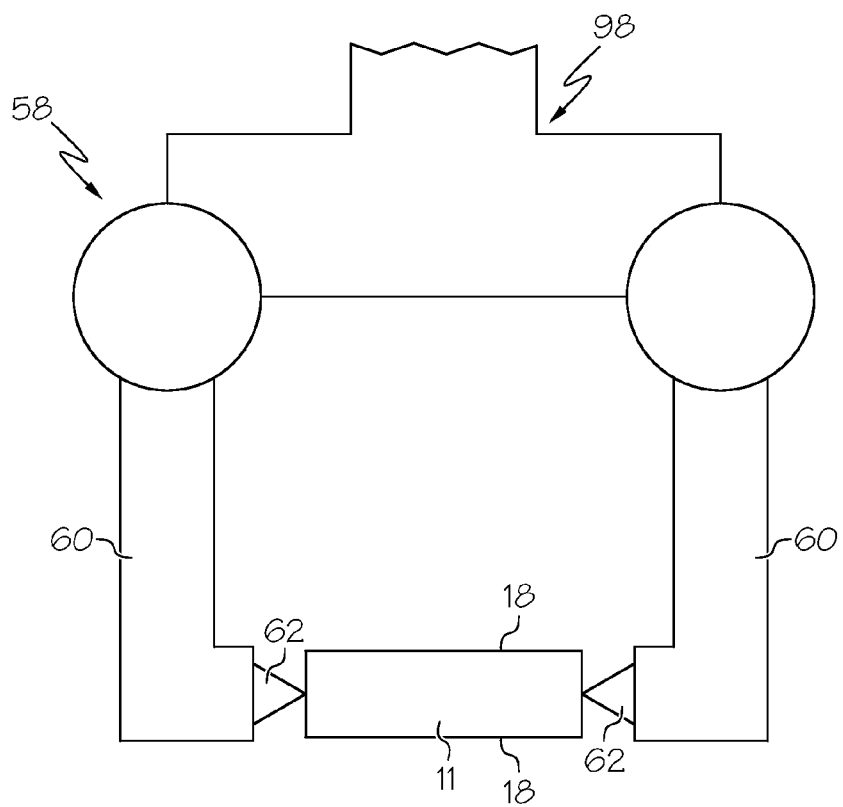
FIG. 9B schematically depicts a side view of an end effector jaw engaged with a fractional component according to one or more embodiments shown and described herein.

Referring collectively to FIGS. 3 and 9A-9B, the fractional components 11 can be manipulated via the jaw members 60 of the one or more robot arms 98. Specifically, the enhanced lateral force gripper tips 62 can engage the fractional component 11, while avoiding contact with the direct bonding surface 18. Accordingly, the cleanliness of the direct bonding surfaces 18 can be maintained at a level suitable for direct fusion bonding. For example, the enhanced lateral force gripper tips 62 can make three-point contact with a non-bonding side of the fractional component 11. When the enhanced lateral force gripper tips 62 grip the sides of a fractional component 11, a divot can be formed at the location of contact. The use of a relatively low number of enhanced lateral force gripper tips 62 can limit deformation of the sides of a fractional component 11. Additionally, the enhanced lateral force gripper tips 62 can be spaced from one another in a predetermined manner such that the location of deformations can be tracked during assembly. In embodiments of fractional components 11 comprising silicon, the deformations can be divots by the enhanced lateral force gripper tips 62. The divots can range in depth from about 10 nm to hundreds of nanometers. Alternatively or additionally, plastic grippers can be utilized to grip the edges of the fractional component 11.

Referring now to FIG. 7B, a first fractional component 12 can be placed by a robotic end effecter 58 onto the semiconductor contacting surface 87 of the assembly table 86 and into lateral contact with the assembly blocks 88 of the assembly table 86. Accordingly, the assembly blocks 88 and the semiconductor contacting surface 87 keep the first fractional component 12 in a predetermined location with the direct bonding surface 18 of the first fractional component 12 available for direct fusion bonding. The robotic end effecter 58 can then grasp a second fractional component 14 and move the direct bonding surface 18 of the second fractional component towards the direct bonding surface 18 of first fractional component 11.

In some embodiments, the one or more robot arms 98 can be configured to place the direct bonding surface 18 of the second fractional component 14 into contact with the direct bonding surface 18 of the first fractional component 12 at an initial contact end 13 of each of the fractional components 12, 14 to define an initial contact area 19. When the fractional components 12, 14 are urged into contact, an angle of approach a can be formed there between. Accordingly, the direct bonding surfaces 18 can be spaced from one another, with the space growing from the initial contact end 13 to a non-contacting end 15 according to the angle of approach a. The direct fusion bond can be formed by closing the angle of approach a. The direct fusion bond can be larger than the initial contact area 19. Accordingly, a wave front can be created along the direct bonding surfaces 18 as the direct bonding surfaces 18 are placed further into contact starting from the initial contact area 19 and moving towards the non-contacting end 15. The wave front can remove substantially all the air between the direct bonding surfaces 18 of the fractional components 12, 14 and reduce the occurrence of voids between the fractional components 12, 14.

In some embodiments, a second robot arm 198 can be configured to urge the second fractional component 14 into more complete contact with the first fractional component 12 such that the direct bonding surfaces 18 overlap the desired amount. Specifically, the second robot arm 198 can close the angle of approach a between the direct bonding surfaces 18 of the fractional components 12, 14 to create the direct fusion bond. Specifically, the second robot arm 198 can comprise pusher member 90 operable to close the angle of approach 92 between the first fractional component 12 and the second fractional component 14. The pusher member 90 can contact an outer surface 21 of the second fractional component 14 at initial contact end 13. The pusher member 90 can then slide across the outer surface 21 of the second fractional component 14 towards the non-contacting end 15 to generate the wave front for the direct fusion bond. In further embodiments, the wave front can be created by initially contacting the fractional components 12, 14 at a wave front center and radially propagating the wave front, as described, above from the central contact point.

Referring again to FIG. 7C, the assembly table 86 can be rotated to enhance direct bonding and reduce defective bonding. In some embodiments, the fractional component 11 can be inverted, i.e., the tilt angle θ of the table can be set from about 90° to about 270° such as, for example, about 180° in one embodiment. When inverted, the assembly table 86 can include an engagement means for securing the fractional component 11 to the semiconductor contacting surface 87 such as, for example, electrostatic charge member or a suction member. Inverting the fractional components 11 can reduce the probability of particles landing on the direct bonding surfaces 18 of the fractional components 11. In some embodiments, it can be possible to break the cleanroom environment after the assembly process. After semiconductor laminate structures 100 are bonded and assembled, one or more surfaces that are not sensitive to contamination can remain exposed.

Figure 11A:
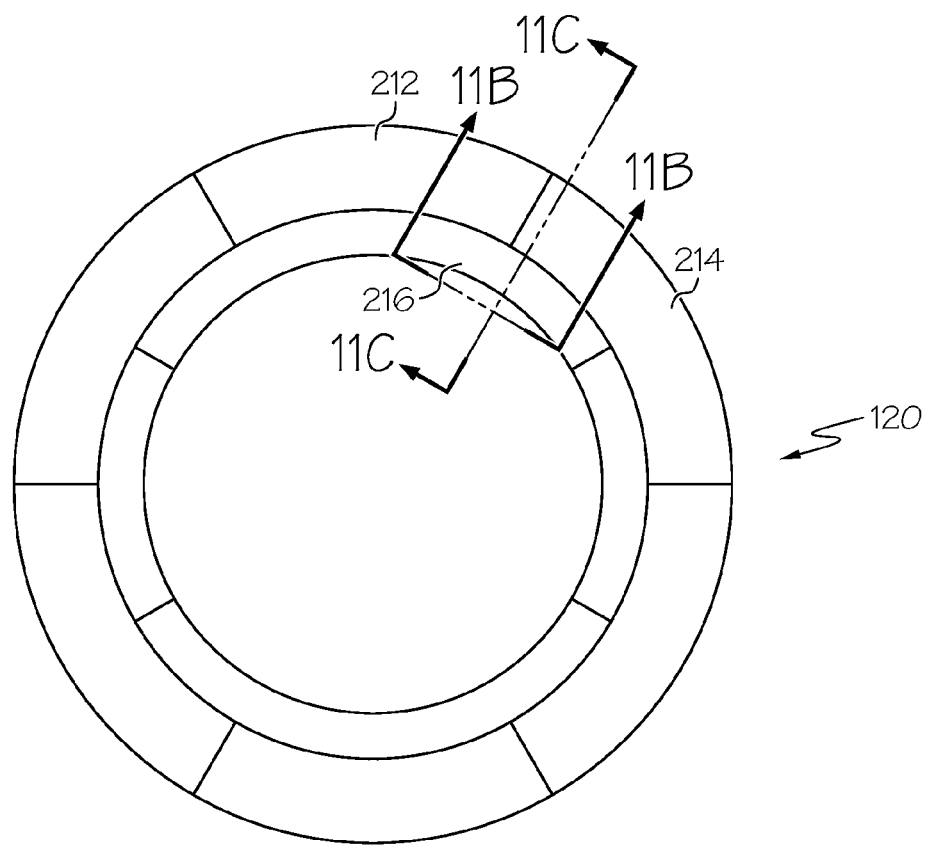
FIG. 11A schematically depicts a top view of a semiconductor laminate structure according to one or more embodiments shown and described herein.
Figure 11B:
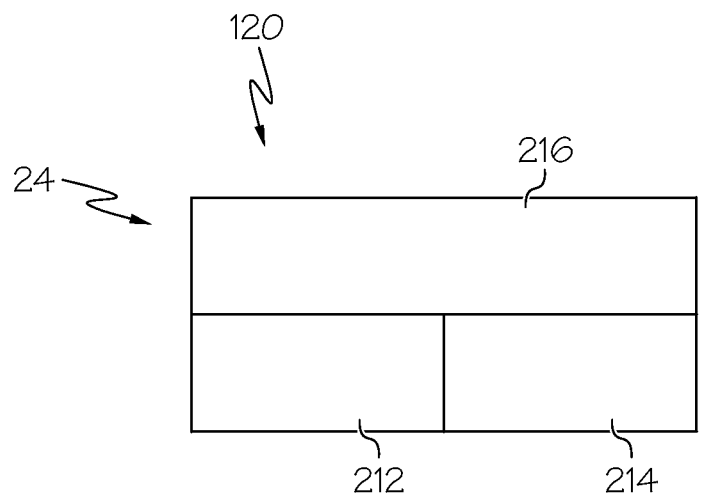
FIG. 11B schematically depicts a partial view of the semiconductor laminate structure depicted in FIG. 11A according to one or more embodiments shown and described herein.
Figure 11C:
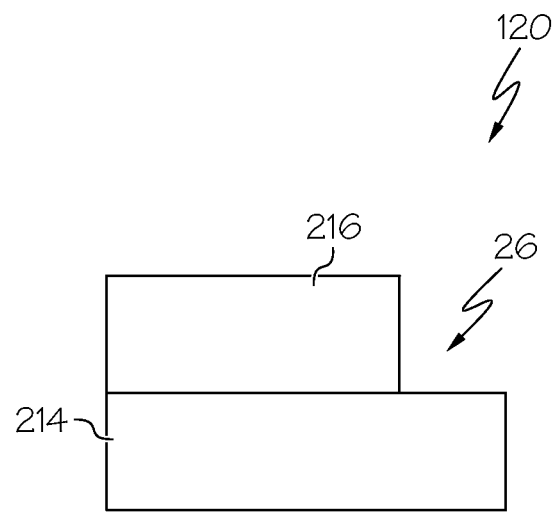
FIG. 11C schematically depicts a partial view of the semiconductor laminate structure depicted in FIG. 11A according to one or more embodiments shown and described herein.

Referring collectively to FIGS. 3 and 11A-11C, the embodiments described herein can be utilized to assemble the semiconductor laminate structures 100 of various shapes. In some embodiments, a silicon laminate structure 120 can be assembled into an edge ring. The silicon laminate structure 120 can comprise a first fractional component 212, a second fractional component 214, and a third fractional component 216 assembled in an alternating courses structure 24. In the alternating courses structure 24, the first fractional component 212 is adjacent to the second fractional component 214. The first fractional component 12 and the second fractional component 14 can each be direct bonded to a portion of the third fractional component 216. It is noted that, while one alternating courses structure 24 is depicted in FIG. 11B, the embodiments described herein can comprise a plurality of alternating courses structures 24. The silicon laminate structure 120 can further comprise a stair step structure 26. The stair step structure 26 can be formed by two fusion bonded fractional components 11 that do not completely overlap. For example, the second fractional component 214 can be direct fusion bonded with the third fractional component 216 such that a portion of the second fractional component 214 is uncovered by the third fractional component 216. The stair step structure 26 can be repeated multiple times to form a staggered section of a semiconductor laminate structure 100 or an angled section of a semiconductor laminate structure 100.

Figure 12:
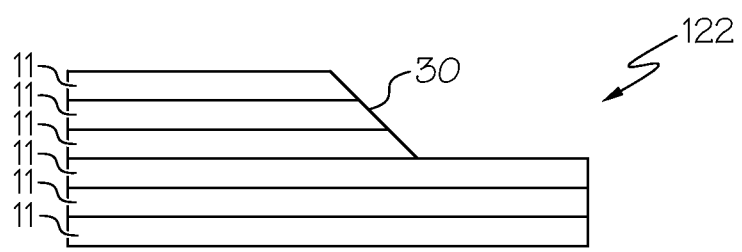
FIG. 12 schematically depicts a semiconductor laminate structure with fractional components arranged in a stair step structure having an angled edge according to one or more embodiments shown and described herein.

Referring now to FIG. 12 a semiconductor laminate structure 122 can comprise an angled surface 30. For example, the semiconductor laminate structure 122 can be formed from a plurality of fractional components 11. The angled surface 30 can be formed by smoothing a stair step structure 26 (FIG. 11C), by cutting each of the fractional components 11 prior to assembly, of combinations thereof.

Figure 13A:
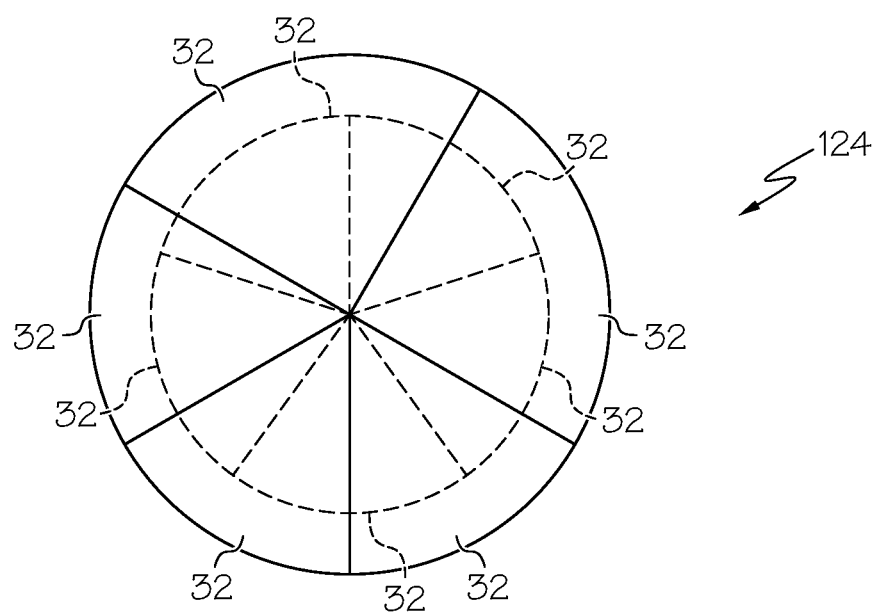
FIG. 13A schematically depicts a semiconductor showerhead electrode according to one or more embodiments shown and described herein.
Figure 13B:
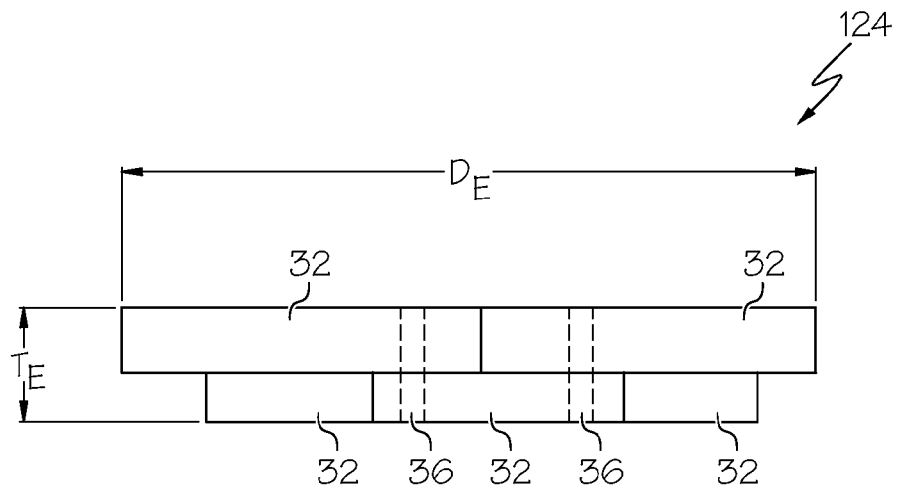
FIG. 13B schematically depicts a semiconductor laminate structure with gas flow channels according to one or more embodiments shown and described herein.

Referring collectively to FIGS. 13A and 13B, a semiconductor laminate structure 124 can be formed into a semiconductor showerhead electrode for a semiconductor processing chamber. In some embodiments, a plurality of pie-shaped fractional components 32 can be assembled into the semiconductor laminate structure 124. An exemplary embodiment of the semiconductor laminate structure 124 can be formed into a semiconductor showerhead electrode having a thickness $T_E$ of about 10 mm thick and a diameter of about 500 to about 600 mm.

Referring collectively to FIGS. 3 and 13B, the fractional components 11, 32 can be drilled prior to assembly. The pre-drilled holes can create gas flow channels 36 in the semiconductor laminate structures 124 for permitting gas to flow through the semiconductor laminate structures 124. The gas flow channels 36 can facilitate air removal during the assembly process which can remove contaminants from the direct bonding surfaces 18. In some embodiments, electron beams or through silicon via (TSV) technology can be utilized to drill the gas flow channels 36 into the fractional components 11, 32. Alternatively or additionally, the semiconductor wafers 10 can be drilled before introduction to the manufacturing system 200.

Figure 14:
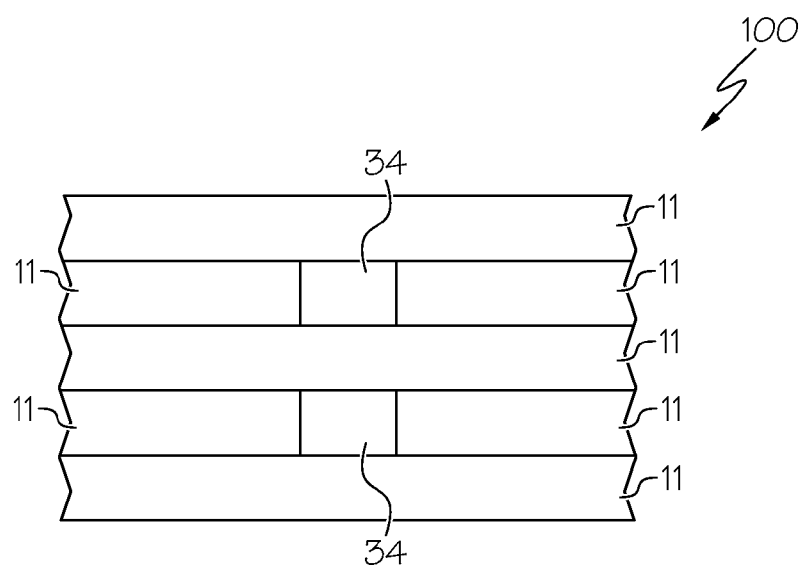
FIG. 14 schematically depicts a semiconductor laminate structure with gas passages according to one or more embodiments shown and described herein.

Referring collectively to FIGS. 2, 3 and 14, the semiconductor laminate structures 100 can further comprise gas passages 34 for permitting the flow of gas within the semiconductor laminate structures 100. In some embodiments, the fractional components 11 can be assembled such that the gas passages 34 are formed from voids between adjacent ones of the fractional components 11. Accordingly, the semiconductor laminate structures 100 can be formed into objects having a plurality of gas passages 34 such as, for example, manifolds, showerhead electrodes, wafer end effecters, mass flow controllers, or the like.

Referring again to FIG. 3, the semiconductor laminate structures 100 can be annealed after being assembled. For example, the semiconductor laminate structures 100 can be annealed in an annealing oven 96 to strengthen the direct fusion bonds. After annealing, the parts can be packaged by the one or more robot arms 98 while still in a clean room environment.

It should now be understood that the embodiments described herein can be utilized to form a variety of semiconductor laminate structures from a plurality fractional components of one or more semiconductor wafer. Compared to cutting large discs from a semiconductor ingot and machining the disc into a usable part (e.g., a showerhead electrode), the use of semiconductor wafers can reduce manufacturing cost. Furthermore, the fractional components can be formed into any predetermined shape, which can yield semiconductor laminate structures than cannot be machined.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method for forming a direct fusion bond between fractional components of a semiconductor laminate structure, the method comprising:
   generating one or more direct bonding surfaces on each of a plurality of semiconductor wafers;
   cutting a first fractional component and a second fractional component from at least one of the plurality of semiconductor wafers, wherein the first fractional component comprises a first direct bonding surface of the one or more direct bonding surfaces and the second fractional component comprises a second direct bonding surface of the one or more direct bonding surfaces;
   drying the first direct bonding surface of the first fractional component and the second direct bonding surface of the second fractional component;
   constraining the first fractional component with an assembly block;
   placing the second direct bonding surface of the second fractional component into contact with the first direct bonding surface of the first fractional component to define an initial contact area, wherein an angle of approach is formed between the second direct bonding surface of the second fractional component and the first direct bonding surface of the first fractional component; and
   closing the angle of approach between the second direct bonding surface of the second fractional component and the first direct bonding surface of the first fractional component to create a direct fusion bond of a semiconductor laminate structure, wherein the direct fusion bond is larger than the initial contact area.

2. The method of claim 1, wherein the first fractional component borders the second fractional component, and a third fractional component is bonded with the first fractional component and the second fractional component.

3. The method of claim 1, wherein a first surface of the first fractional component is bonded with a first portion of a second surface of the second fractional component wherein a second portion of the second surface of the second fractional component is unbonded.

4. The method of claim 1, wherein each of the plurality of semiconductor wafers comprises silicon, silicon dioxide, gallium arsenide, sapphire, silicon carbide, or a combination thereof.

5. The method of claim 4, wherein each of the plurality of semiconductor wafers comprises single crystal silicon.

6. The method of claim 1 wherein the first direct bonding surface of the first fractional component is hydrophilic.

7. The method of claim 1 wherein the first direct bonding surface of the first fractional component is hydrophobic.

8. The method of claim 1, further comprising:
cooling the at least one of the plurality of semiconductor wafers with a laminar water jet; and
propagating a laser beam through the laminar water jet and towards the at least one the plurality of semiconductor wafers;
wherein the laser beam cuts the at least one the plurality of semiconductor wafers into the first fractional component and the second fractional component.

9. The method of claim 8, further comprising oxidizing the first fractional component.

10. The method of claim 9, wherein the laminar water jet comprises an oxidizer.

11. The method of claim 10, wherein the oxidizer comprises hydrogen peroxide, deionized water saturated with oxygen, ozonated deionized water, or a combination thereof.

12. The method of claim 9, further comprising chemically etching the first fractional component.

13. The method of claim 1, further comprising:
placing each of the plurality of semiconductor wafers on a fixture; and
cutting each of the plurality of semiconductor wafers into one or more fractional components on the fixture.

14. The method of claim 13, further comprising placing each of the plurality of semiconductor wafers on one or more selectively translatable pins engaged with the fixture.

15. The method of claim 1, further comprising:
transporting the first fractional component from a cutting station to an assembly station; and
drying the first fractional component with isopropyl alcohol vapor; wherein the isopropyl alcohol vapor is generated by one or more isopropyl alcohol vapor nozzles interposed between the cutting station and the assembly station.

16. The method of claim 1, further comprising constraining the first fractional component with an assembly table comprising a plurality of assembly blocks wherein the assembly table constrains the first fractional component in a first direction and at least one of the assembly blocks constrains the first fractional component in a second direction.

17. The method of claim 16, wherein the assembly table is tiltable.

18. The method of claim 17, further comprising constraining the first fractional component to a semiconductor contacting surface of the assembly table with engagement member while the assembly table is substantially inverted.

19. The method of claim 1, further comprising:
grasping the first fractional component with two or more enhanced lateral force gripper tips of at least one jaw member of a first robot arm;
placing the first fractional component into contact with an assembly table;
grasping the second fractional component with two or more enhanced lateral force gripper tips of at least one jaw member of the first robot arm; and
placing the second direct bonding surface of the second fractional component into initial contact with the first direct bonding surface of the first fractional component at an initial contact end of each of the first fractional component and the second fractional component.

20. The method of claim 1, further comprising:
contacting an outer surface of the second fractional component with a pusher member of a second robot arm; and
urging the second direct bonding surface of the second fractional component onto the first direct bonding surface of the first fractional component by sliding the pusher member of the second robot arm across the outer surface of the second fractional component from a contact end of the second fractional component to a non-contact end of the second fractional component.

21. The method of claim 1, further comprising annealing the semiconductor laminate structure.

22. The method of claim 1, wherein the first fractional component comprises an arc, a rectangle, a square, or a circle.

23. The method of claim 1, further comprising providing a predetermined pattern for the semiconductor laminate structure wherein the predetermined pattern comprises a semiconductor showerhead electrode, a gas manifold, or a mass flow controller.

24. The method of claim 1, wherein the at least one of the plurality of semiconductor wafers has a diameter and the semiconductor laminate structure has at least one dimension larger than the diameter of each of the at least one of the plurality of semiconductor wafers.

25. The method of claim 1, wherein the first direct bonding surface of the first fractional component and the second direct bonding surface of the second fractional component are dried with isopropyl alcohol vapor.

* * * * *